(12) United States Patent
Kim et al.

(10) Patent No.: US 11,257,786 B2
(45) Date of Patent: Feb. 22, 2022

(54) SEMICONDUCTOR PACKAGE INCLUDING MOLDING MEMBER, HEAT DISSIPATION MEMBER, AND REINFORCING MEMBER

(71) Applicant: SAMSUNG ELECTRONICS CO., LTD., Suwon-si (KR)

(72) Inventors: Sunchul Kim, Hwaseong-si (KR); Kyungsuk Oh, Seongnam-si (KR); Taehun Kim, Asan-si (KR); Pyoungwan Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/821,342

(22) Filed: Mar. 17, 2020

(65) Prior Publication Data

US 2021/0066244 A1 Mar. 4, 2021

(30) Foreign Application Priority Data

Aug. 28, 2019 (KR) ........................ 10-2019-0105755

(51) Int. Cl.
*H01L 25/065* (2006.01)
*H01L 25/18* (2006.01)
(Continued)

(52) U.S. Cl.
CPC ........ *H01L 25/0652* (2013.01); *H01L 23/562* (2013.01); *H01L 25/18* (2013.01); *H01L 25/50* (2013.01); *H01L 2225/0651* (2013.01); *H01L 2225/06506* (2013.01); *H01L 2225/06513* (2013.01); *H01L 2225/06517* (2013.01);
(Continued)

(58) Field of Classification Search
CPC ... H01L 23/36; H01L 23/367; H01L 23/3675; H01L 23/373–3738; H01L 23/42; H01L 23/433; H01L 23/4334; H01L 25/043; H01L 25/0657; H01L 25/074; H01L 25/0756; H01L 25/117;
(Continued)

(56) References Cited

U.S. PATENT DOCUMENTS 6,177,726 B1 * 1/2001 Manteghi ............ H01L 23/3135
257/666
6,952,050 B2 10/2005 Kwon et al.
(Continued)

*Primary Examiner* — Nicholas J Tobergte
*Assistant Examiner* — William H Anderson
(74) *Attorney, Agent, or Firm* — Lee IP Law, P.C.

(57) ABSTRACT

A semiconductor package including a package substrate; a first semiconductor chip on the package substrate; a second semiconductor chip on an upper surface of the first semiconductor chip; an insulating layer on surfaces of the first semiconductor chip and the second semiconductor chip; a heat dissipation member on the insulating layer such that the heat dissipation member includes a region on an upper surface of the first semiconductor chip on which the second semiconductor chip is not disposed, and a region on an upper surface of the second semiconductor chip; a molding member on the package substrate and encapsulating the first semiconductor chip, the second semiconductor chip, and the heat dissipation member such that the molding member exposes at least a portion of an upper surface of the heat dissipation member; and a reinforcing member on the heat dissipation member and the molding member.

19 Claims, 16 Drawing Sheets

(51) Int. Cl.
   *H01L 25/00*    (2006.01)
   *H01L 23/00*    (2006.01)

(52) U.S. Cl.
   CPC ............ *H01L 2225/06541* (2013.01); *H01L 2225/06562* (2013.01); *H01L 2225/06586* (2013.01); *H01L 2225/06589* (2013.01)

(58) Field of Classification Search
   CPC ............ H01L 2225/06503–06524; H01L 2225/06555–06568; H01L 2225/06589
   See application file for complete search history.

(56) References Cited

U.S. PATENT DOCUMENTS

| | | | |
|---|---|---|---|
| 8,759,147 B2* | 6/2014 | Choi | H01L 24/97 438/106 |
| 9,054,067 B2 | 6/2015 | Im et al. | |
| 9,142,523 B2 | 9/2015 | Liu et al. | |
| 9,653,373 B2 | 5/2017 | Kim et al. | |
| 9,831,190 B2 | 11/2017 | Yew et al. | |
| 9,842,798 B2* | 12/2017 | Marimuthu | H01L 21/6835 |
| 10,037,974 B2* | 7/2018 | Chien | H01L 25/0657 |
| 10,153,218 B2 | 12/2018 | Chen et al. | |
| 10,186,467 B2* | 1/2019 | Appelt | H01L 21/486 |
| 10,229,892 B2* | 3/2019 | Appelt | H01L 24/81 |
| 2013/0208426 A1 | 8/2013 | Kim et al. | |
| 2017/0243855 A1* | 8/2017 | Kim | H01L 25/0657 |
| 2018/0190602 A1* | 7/2018 | Lee | H05K 3/4697 |
| 2018/0247912 A1* | 8/2018 | Tseng | H01L 24/97 438/106 |

* cited by examiner

SEMICONDUCTOR PACKAGE INCLUDING MOLDING MEMBER, HEAT DISSIPATION MEMBER, AND REINFORCING MEMBER

CROSS-REFERENCE TO RELATED APPLICATION

Korean Patent Application No. 10-2019-0105755, filed on Aug. 28, 2019, in the Korean Intellectual Property Office, and entitled: "Semiconductor Package," is incorporated by reference herein in its entirety.

BACKGROUND

1. Field

Embodiments relate to a semiconductor package.

2. Description of the Related Art

With the trend for high functionality and miniaturization of electronic components, high performance and miniaturization of packages have been implemented using a system in package (SIP) technology in which a plurality of semiconductor chips having various functions are embedded in a single package.

SUMMARY

The embodiments may be realized by providing a semiconductor package including a package substrate; a first semiconductor chip on the package substrate; at least one second semiconductor chip on a region of an upper surface of the first semiconductor chip; an insulating layer on surfaces of the first semiconductor chip and the at least one second semiconductor chip; a heat dissipation member on the insulating layer such that the heat dissipation member includes a region on an upper surface of the first semiconductor chip on which the at least one second semiconductor chip is not disposed, and a region on an upper surface of the at least one second semiconductor chip; a molding member on the package substrate and encapsulating the first semiconductor chip, the at least one second semiconductor chip, and the heat dissipation member such that the molding member exposes at least a portion of an upper surface of the heat dissipation member; and a reinforcing member on the heat dissipation member and the molding member.

The embodiments may be realized by providing a semiconductor package including a package substrate; a first semiconductor chip on the package substrate; a heat dissipation member on a part of an upper surface of the first semiconductor chip; a molding member on the package substrate and covering an upper surface of the package substrate, one side surface of the first semiconductor chip, and one side surface of the heat dissipation member such that the molding member exposes at least a portion of an upper surface of the heat dissipation member; and a reinforcing member on the heat dissipation member and the molding member, wherein the reinforcing member includes a polymer compound and has a coefficient of thermal expansion greater than a coefficient of thermal expansion of the heat dissipation member and greater than a coefficient of thermal expansion of the molding member.

The embodiments may be realized by providing a semiconductor package including a package substrate; a first semiconductor chip on the package substrate; at least one second semiconductor chip on the first semiconductor chip; an insulating layer on surfaces of the package substrate, the first semiconductor chip, and the at least one second semiconductor chip; a heat dissipation member on the insulating layer such that the heat dissipation member includes a region on the first semiconductor chip that is not overlapped by the least one second semiconductor chip, and a region on the at least one second semiconductor chip that overlaps the first semiconductor chip, when viewed from above perpendicular to the package substrate; a molding member on the package substrate and encapsulating at least a portion of each of the first semiconductor chip, the at least one second semiconductor chip, and the heat dissipation member; and a reinforcing member on the heat dissipation member and the molding member.

The embodiments may be realized by providing a semiconductor package including a substrate; a first semiconductor chip on the substrate; a second semiconductor chip on the first semiconductor chip; an insulating layer on surfaces of the first semiconductor chip and the second semiconductor chip; a heat dissipation member on the insulating layer; a molding member encapsulating at least a portion of each of the first semiconductor chip, the second semiconductor chip, and the heat dissipation member; and a reinforcing member on the heat dissipation member and the molding member, wherein each of the heat dissipation member and the molding member independently has a coefficient of thermal expansion (CTE) of 5 to 40 ppm/° C., and the reinforcing member has a CTE of 50 ppm/° C. or greater.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
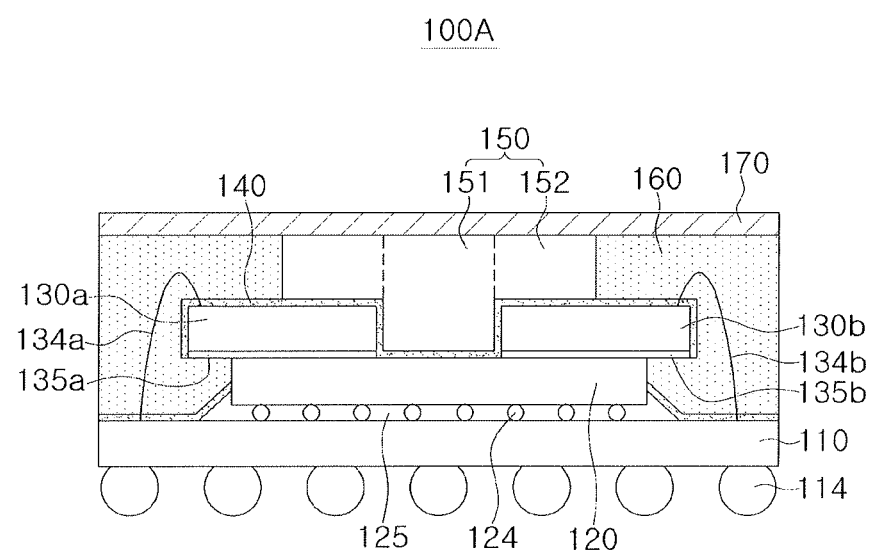
FIG. 1 illustrates a side cross-sectional view of a semiconductor package according to an example embodiment.
Figure 2:
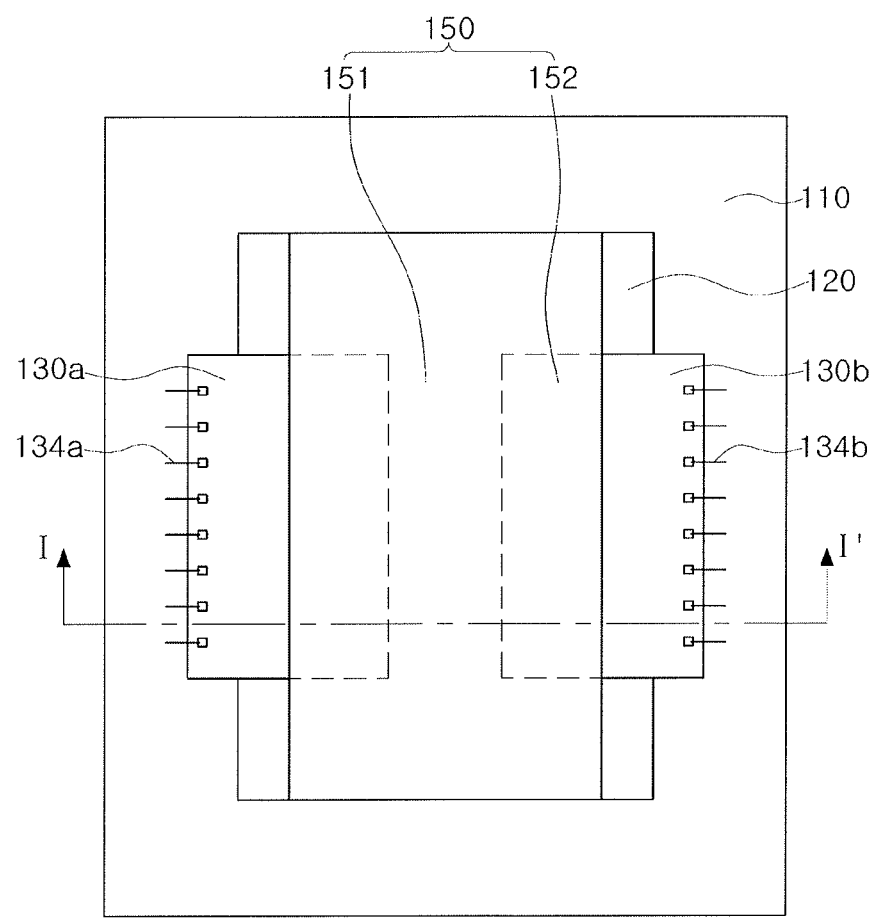
FIG. 2 illustrates a plan view of a partial configuration of the semiconductor package in FIG. 1.

FIG. 1 illustrates a side cross-sectional view of a semiconductor package 100A according to an example embodiment. FIG. 2 illustrates a plan view of a partial configuration of the semiconductor package 100A in FIG. 1. FIG. 1 illustrates a cross-sectional view taken along line I-I' of the partial configuration in FIG. 2.

Referring to FIGS. 1 and 2, a semiconductor package 100A according to an example embodiment may include a package substrate 110, a first semiconductor chip 120, and at least one second semiconductor chip 130a and 130b, a heat dissipation member 150, a molding member 160, and a reinforcing member 170.

The semiconductor package 100A may be a system in package (SIP) in which various types of semiconductor chips are embedded. For example, the first semiconductor chip 120 may be a logic chip, and the at least one second semiconductor chip 130a and 130b may be a memory chip.

The package substrate 110 may be a semiconductor package substrate, e.g., a printed circuit board (PCB), a ceramic substrate, a tape wiring substrate, or the like. For example, the package substrate 110 may include a thermosetting resin such as an epoxy resin or a thermoplastic resin such as polyimide, or a photosensitive insulating layer. In an implementation, the substrate may include a material such as prepreg, an Ajinomoto build-up film (ABF), FR-4, bismaleimide triazine (BT), a photoimageable dielectric (PID) resin, or the like.

In an implementation, the package substrate 110 may include a plurality of pads, respectively on upper and lower surfaces opposing each other, and wirings electrically connecting the plurality of pads to each other. In addition, a lower portion of the package substrate 110 may further include connection terminals 114 connected to pads on the lower surface of the package substrate 110.

The connection terminals 114 may be electrically connected to an external device such as a main board. For example, the connection terminals 114 may have a flip-chip connection structure including a solder ball, a conductive bump, or a grid array such as a pin grid array, a ball grid array, or a land grid array.

The first semiconductor chip 120 may be on the upper (first semiconductor chip-facing) surface of the package substrate 110 and may be electrically connected to a pad on the upper surface of the package substrate 110. For example, the first semiconductor chip 120 may be mounted on the package substrate 110 through connection members 124, on connection electrodes on an active surface (a lower or package substrate-facing surface of "120" in FIG. 1), in a flip-chip bonding manner. An underfill resin 125, including an epoxy resin or the like, covering the connection members 124, may be between the active surface of the first semiconductor chip 120 and the upper surface of the package substrate 110.

In an implementation, the first semiconductor chip 120 may be mounted onto the package substrate 110 in a wire-boding manner.

The first semiconductor chip 120 may include, e.g., a system large scale integration (LSI), a logic circuit, a CMOS imaging sensor (CIS), or the like.

The at least one second semiconductor chip 130a and 130b (hereinafter, at least one second semiconductor chip 130a and 130b may be referred to as "second semiconductor chip 130a and 130b") may be on a portion of an upper surface of the first semiconductor chip 120 (e.g., on a surface of the first semiconductor chip 120 that faces away from the package substrate 110). For example, the second semiconductor chip 130a and 130b may be on the first semiconductor chip 120 and may expose at least a portion of the first semiconductor chip 120. For example, the at least one second semiconductor chip 130a and 130b may be on the first semiconductor chip 120 and may cover a portion of the upper surface of the first semiconductor chip 120, when viewed from above or in plan view (e.g., as viewed in FIG. 2). The at least one second semiconductor chip 130a and 130b may partially overlap the first semiconductor chip 120.

For example, the second semiconductor chips 130a and 130b may be side by side and spaced apart from each other on the upper surface of the first semiconductor chip 120 to expose a central portion of the first semiconductor chip 120, when viewed from above. The heat dissipation member 150 (described in greater detail below) may be on the exposed central portion of the first semiconductor chip 120 to effectively dissipate heat (e.g., heat generated in the first semiconductor chip 120) outwardly of the semiconductor package.

Figure 12:
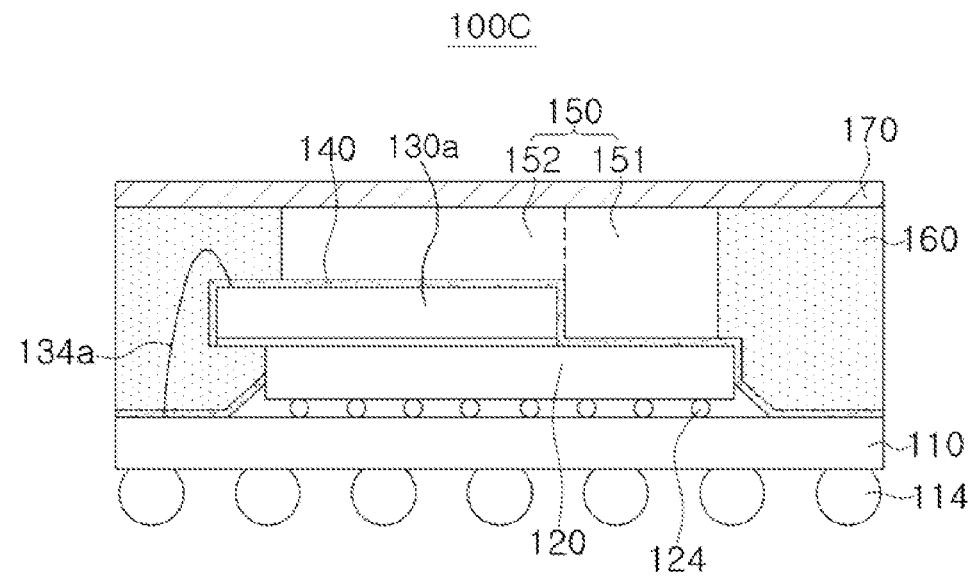
FIG. 12 illustrates a side cross-sectional view of a semiconductor package according to an example embodiment.
Figure 13:
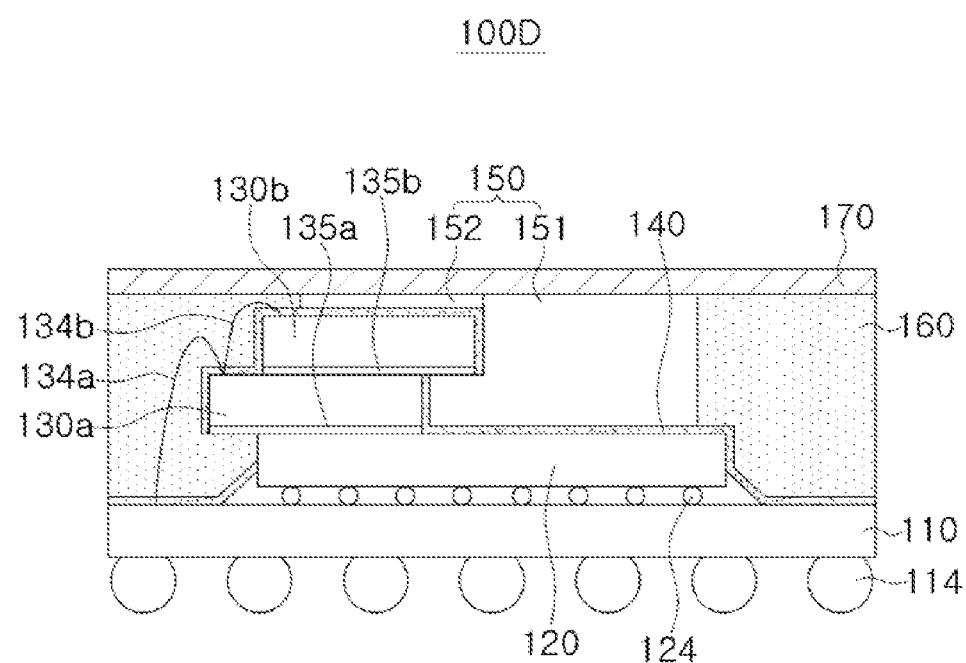
FIG. 13 illustrates a side cross-sectional view of a semiconductor package according to an example embodiment.
Figure 15:
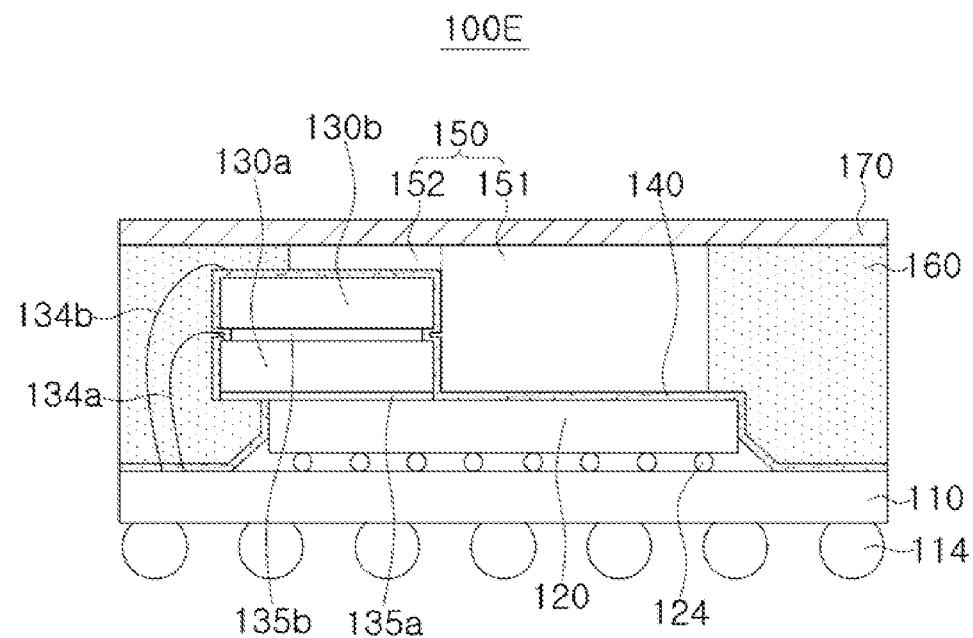
FIG. 15 illustrates a side cross-sectional view of a semiconductor package according to an example embodiment.

In an implementation, a single second semiconductor chip 130a may be on one side of the first semiconductor chip 120 (see FIG. 12), or a plurality of second semiconductor chip 130a and 130b may be stacked on one side of the first semiconductor chip 120 (see FIGS. 13 and 15).

In an implementation, the at least one second semiconductor chip 130a and 130b may be electrically connected to the package substrate 110 by bonding wires 134a and 134b. In an implementation, the at least one second semiconductor chip 130a and 130b, on the first semiconductor chip 120, may be electrically connected to the first semiconductor chip 120 through a wiring layer or a connection pad on the upper surface of the first semiconductor chip 120.

The at least one second semiconductor chip 130a and 130b may be attached to the first semiconductor chip 120 by attachment members 135a and 135b. The attachment members 135a and 135b may include a polymeric material having improved thermal conductivity. In an implementation, the attachment members 135a and 135b may be a thermally conductive adhesive tape, a thermally conductive grease, a thermally conductive adhesive, or the like.

The at least one second semiconductor chip 130a and 130b may include, e.g., a memory chip such as a DRAM, an SRAM, a flash memory, a PRAM, an ReRAM, an FeRAM, an MRAM, a high bandwidth memory (HBM), a hybrid memory cubic (HMC), or the like.

The above-described type, number, disposition, and the like of the first and second semiconductor chips are proposed as an example, and may be varied as desired.

An insulating layer 140 may be on surfaces of the first semiconductor chip 120 and the second semiconductor chip 130a and 130b. The insulating layer 140 may be conformally coated on the entire exposed surface of the package substrate 110, the first semiconductor chip 120, and the second semiconductor chip 130a and 130b. For example, the insulating layer 140 may be coated on the upper surface of the package substrate 110, an upper surface and at least a portion of a side surface of the first semiconductor chip 120 (e.g., on which the second semiconductor chip 130a and 130b are not disposed or surfaces not covered by the second semiconductor chip 130a and 130b), and the upper surface and a side surface of the second semiconductor chip 130a and 130b. The insulating layer 140 may be conformally coated on the first semiconductor chip 120 and the second semiconductor chip 130a and 130b to help reduce the possibility of and/or prevent a short-circuit between the heat dissipation member 150, and the first semiconductor chip 120 and the second semiconductor chip 130a and 130b when the heat dissipation member 150 is formed on the first semiconductor chip 120 and the second semiconductor chip 130a and 130b.

The insulating layer 140 may include an insulating material having good thermal conductivity. In an implementation, the insulating layer 140 may include, e.g., silica ($SiO_2$), an aluminum oxide ($Al_2O_3$), a boron nitride (BN), an aluminum nitride (AlN), a ceramic coated metal ball, or the like.

The heat dissipation member 150 may be on the insulating layer 140. In an implementation, the heat dissipation member 150 may be on a region of the upper surface of the first semiconductor chip 120 that is not covered by the second semiconductor chip 130a and 130b, and may be on a region of the upper surface of the second semiconductor chip 130a and 130b. For example, the heat dissipation member 150 may have a first region 151, on the first semiconductor chip 120 exposed by the second semiconductor chip 130a and 130b, and a second region 152 on the second semiconductor chip 130a and 130b. The heat dissipation member 150 may be on the insulating layer 140 and may be formed throughout a region, in which the first semiconductor chip 120 overlaps the second semiconductor chip 130a and 130b, and a region in which the first semiconductor chip 120 does not overlap the second semiconductor chip 130a and 130b, when viewed from above (e.g., in plan view).

The first region 151 may be directly on the first semiconductor chip 120 in an effort to help dissipate a large amount of heat, e.g., heat generated in the first semiconductor chip 120. The second region 152 may be directly on the second semiconductor chip 130a and 130b in an effort to help dissipate heat, e.g., heat generated in the second semiconductor chips 130a and 130b and the heat transferred from the first region 151 and generated in the first semiconductor chip 120. An area of the first region 151 may be larger than an area of the second region 152, when viewed from above (e.g., when viewed in a direction orthogonal to the upper surface of the package substrate 110). The heat dissipation performance may be improved by significantly securing the area of the first region 151, formed directly on the first semiconductor chip 120 having relatively larger heat dissipation amount than the second semiconductor chips 130a and 130b.

In an implementation, the first region 151 and the second region 152 of the heat dissipation member 150 may be integrally formed. For example, upper surfaces of each of the first region 151 and the second region 152 may be disposed on the same level (e.g., a same distance from the upper surface of the package substrate 110 or coplanar). The first region 151 may be in contact with at least a portion of the insulating layer 140, coated on the upper surface of the first semiconductor chip 120, and at least a portion of the insulating layer 140 coated on side surfaces of the second semiconductor chip 130a and 130b. The second region 152 may be in contact with at least a portion of the insulating layer 140 coated on the upper surfaces of the second semiconductor chips 130a and 130b.

The heat dissipation member 150 may include, e.g., a metal such as gold (Au), silver (Ag), copper (Cu), or the like, or a conductive material such as graphite, graphene, or the like.

The molding member 160 may be on the package substrate 110, and may cover the first semiconductor chip 120, the second semiconductor chip 130a and 130b, an upper surface of the package substrate 110, and side surfaces of the heat dissipation member 150 and may expose at least a portion of the upper surface of the heat dissipation member 150. For example, the molding member 160 may cover the side surface of the heat dissipation member 150, and may expose the upper surface of the heat dissipation member 150. For example, the molding member 160 may not completely cover the heat dissipation member 150 such that the upper surface of the heat dissipation member 150 may be exposed (e.g., may face outwardly in the semiconductor package 100A). For example, the upper surface of the heat dissipation member 150 may be on the same level as the upper surface of the molding member 160 (e.g., the upper surfaces may be the same distance from the package substrate 110 or may be coplanar). The molding member 160 may include an insulating material. In an implementation, the insulating material of the molding member 160 may include, e.g., an epoxy molding compound (EMC) or the like.

The reinforcing member 170 may be on the heat dissipation member 150 and the molding member 160, and may have a modulus of elasticity and a coefficient of thermal expansion (CTE) greater than the modulus of elasticity and CTE of each of the heat dissipation member 150 and the molding member 160. The reinforcing member 170 may be in direct contact with the upper surface of the heat dissipation member 150 to help prevent cracking in the upper surface of the heat dissipation member 150. In an implementation, the heat dissipation member 150 may be a conductive material having, e.g., a CTE of about 5 to about 40 ppm/° C. and a modulus of elasticity of about 10 to about 20 GPa, and the molding member 160 may be an insulating material having, e.g., a CTE of about 5 to about 40 ppm/° C. and a modulus of elasticity of about 20 to about 35 GPa.

The reinforcing member 170 may have a modulus of elasticity greater than a modulus of elasticity of each of the heat dissipation member 150 and the molding member 160 to help disperse stress applied to the heat dissipation member 150. In addition, the reinforcing member 170 may have a CTE greater than a CTE of each of the heat dissipation member 150 and the molding member 160 to help offset or compensate for warpage stress caused by a difference in the CTE between the molding member 160 and the heat dissipation member 150.

The reinforcing member 170 may have a thickness ranging from, e.g., about 5 to about 40 μm or from about 10 to about 30 μm. The reinforcing member 170 may include a polymer compound having a CTE of, e.g., about 50 ppm/° C. or greater and a modulus of elasticity of about 35 GPa or greater. In an implementation, the reinforcing member 170 may include a polymer compound having, e.g., a CTE of about 100 ppm/° C. or greater and a modulus of elasticity of about 56 GPa or greater. In an implementation, the reinforcing member 170 may be above the heat dissipation member 150 (e.g., on or toward an outer side of the semiconductor package 100A), and the reinforcing member 170 may have thermal conductivity of, e.g., about 3 W/Mk or more to help maintain or facilitate heat dissipation performance. In an implementation, the polymer compound may include, e.g., an epoxy resin that includes a bisphenol A resin, a bisphenol F resin, or a novolak resin. In an implementation, the modulus of elasticity may be determined from a slope of a stress-strain curve produced by a flexural test. For example, a flexural modulus or a bending modulus of a specimen can be determined by fixing one end of the specimen and bending the specimen by applying a load in a direction perpendicular to the side surface of the specimen.

As described above, the semiconductor package 100A according to an example embodiment may include the heat dissipation member 150 (having the first region 151 on the first semiconductor chip 120 and the second region 152 on the second semiconductor chip 130a and 130b) and the reinforcing member 170 covering the heat dissipation member 150.

The first region 151 of the heat dissipation member 150 may be on the first semiconductor chip 120, and the upper surface of the heat dissipation member 150 may be exposed (e.g., by the molding member 160 such that the upper surface of the heat dissipation member 150 faces outwardly in the semiconductor package 100A), so that the heat, generated in the first semiconductor chip 120 having relatively high heat dissipation amount, may be effectively dissipated through the first region 151 of the heat dissipation member 150.

If the upper surface of the heat dissipation member 150 were to be fully exposed, the upper surface could be easily cracked by external impacts or warpage. In an implementation, the reinforcing member 170 may cover the (e.g., exposed) upper surface of the heat dissipation member 150, thereby reducing the possibility of or preventing deformation of the heat dissipation member 150 or damage to the heat dissipation member 150.

FIGS. 3 to 8 illustrate side cross-sectional views of stages in a method of manufacturing the semiconductor package in FIG. 1.

Figure 3:
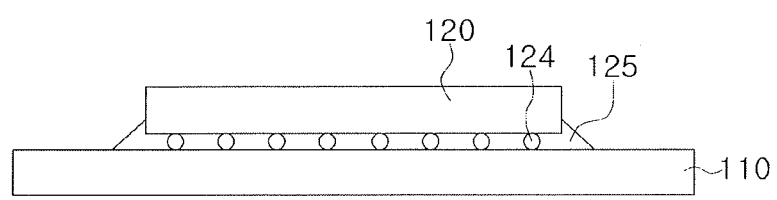
FIGS. 3 to 8 illustrate side cross-sectional views of stages in a method of manufacturing the semiconductor package in FIG. 1.

Referring to FIG. 3, a first semiconductor chip 120 may be mounted on an upper surface of a package substrate 110. The package substrate 100 may include a printed circuit board (PCB), a ceramic substrate, or the like.

The first semiconductor chip 120 may be mounted on the package substrate 110 in a flip-chip bonding manner. The first semiconductor chip 120 may be electrically connected to the package substrate 110 through connection members 124. The connection members 124 may be solder balls and may be connected to pads on an upper surface of the package substrate 110.

An underfill resin 125 (for encapsulating and supporting the connection members 124) may be formed or provided between the first semiconductor chip 120 and the package substrate 110.

Figure 4:
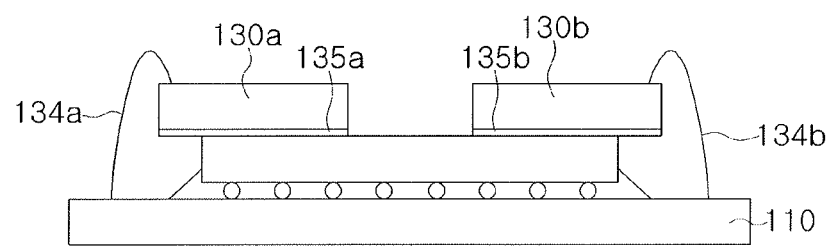

Referring to FIG. 4, second semiconductor chips 130a and 130b may be spaced apart from each other on an upper surface of the first semiconductor chip 120, e.g., may expose a central portion of the first semiconductor chip 120. The second semiconductor chips 130a and 130b may partially overlap the first semiconductor chip 120, when viewed from above.

The second semiconductor chips 130a and 130b may be attached to the first semiconductor chip 120 by attachment members 135a and 135b. The attachment members 135a and 135b may include a polymeric material having good thermal conductivity.

The second semiconductor chips 130a and 130b may be electrically connected to the package substrate 110 in a wire bonding manner. The second semiconductor chips 130a and 130b may be connected to pads on the package substrate 110 by bonding wires 134a and 134b.

Figure 5:
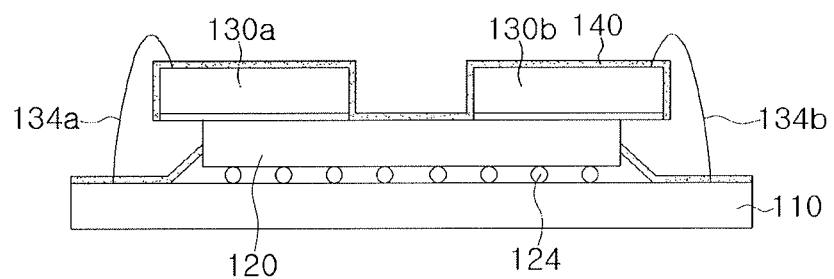

Referring to FIG. 5, an insulating layer 140 may be formed on the package substrate 110, the first semiconductor chip 120, and the second semiconductor chips 130a and 130b. In an implementation, the insulating layer 140 may be conformally coated on entire exposed surfaces of the package substrate 110, the first semiconductor chip 120, and the second semiconductor chips 130a and 130b by, e.g., a spray coating process.

For example, an insulating layer 140 having a uniform thickness may be formed on an upper surface of the package substrate 110, an upper surface and at least a portion of side surfaces of the first semiconductor chip 120 (on which the second semiconductor chips 130a and 130b are not disposed), and upper surfaces and side surfaces of the second semiconductor chip 130a and 130b.

The insulating layer 140 may include, e.g., silica ($SiO_2$), an aluminum oxide ($Al_2O_3$), a boron nitride (BN), an aluminum nitride (AlN), a ceramic coated metal ball, or the like, having good thermal conductivity.

Figure 6:
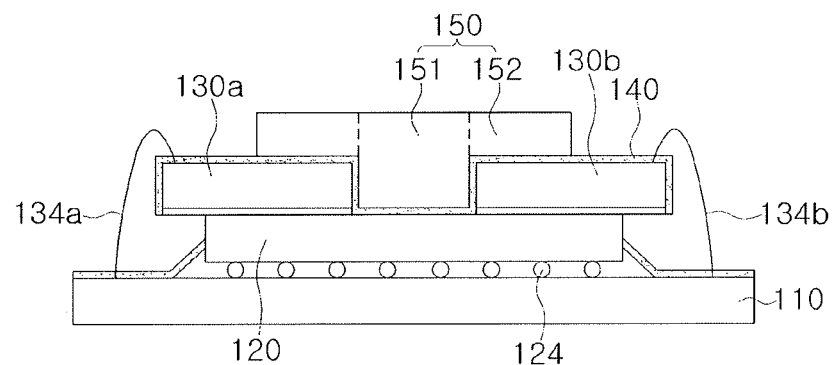

Referring to FIG. 6, a heat dissipation member 150 may be formed on the insulating layer 140 coated on the first semiconductor chip 120 and the insulating layer 140 coated on the second semiconductor chip 130a and 130b.

The heat dissipation member 150 may have a first region 151 (on the insulating layer 140 coated on the first semiconductor chip 120) and a second region 152 (on the insulating layer 140 coated on the second semiconductor chip 130a and 130b).

The heat dissipation member 150 may be formed by, e.g., a dispensing process, a screen-printing process, or the like. For example, the first region 151 and the second region 152 may be formed by continuously or repeatedly (two or more times) dispensing a metal paste on the insulating layer 140, coated on the first semiconductor chip 120, and the insulating layer 140 coated on the second semiconductor chip 130a and 130b. For example, the first region 151 and the second region 152 may be integrally formed.

The heat dissipation member 150 may include a metal material having good thermal conductivity. The heat dissipation member 150 may be formed on the insulating layers 140 coated on the first semiconductor chip 120 and the second semiconductor chips 130a and 130b, and a short-circuit with the first semiconductor chip 120 and the second semiconductor chips 130a and 130b may be prevented.

Figure 7:
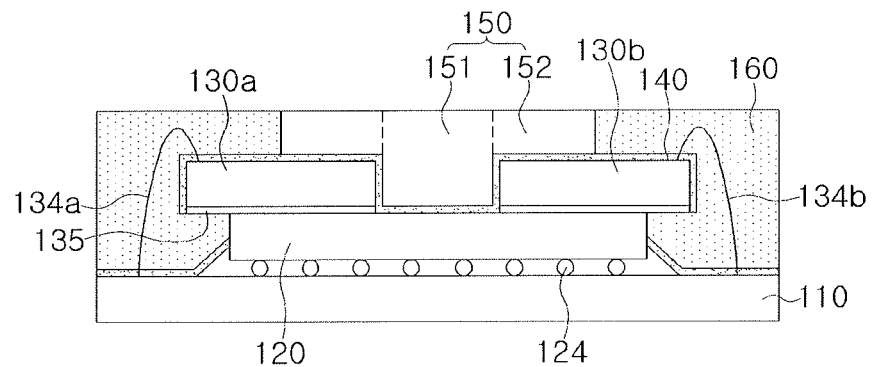

Referring to FIG. 7, a molding member 160 may be formed on the package substrate 110. The molding member 160 may encapsulate a side surface of the heat dissipation member 150 and may expose at least a portion of the upper surface of the heat dissipation member 150.

For example, after the molding member 160 is applied to cover the upper surface of the heat dissipation member 150, an upper portion of the molding member 160 may be ground or otherwise removed to expose the upper surfaces of each of the first region 151 and the second region 152 of the heat dissipation member 150. For example, the upper surface of each of the first region 151 and the second region 152 of the heat dissipation member 150 may be at the same level as the upper surface of the molding member 160 (e.g., the surfaces may be coplanar).

Figure 8:
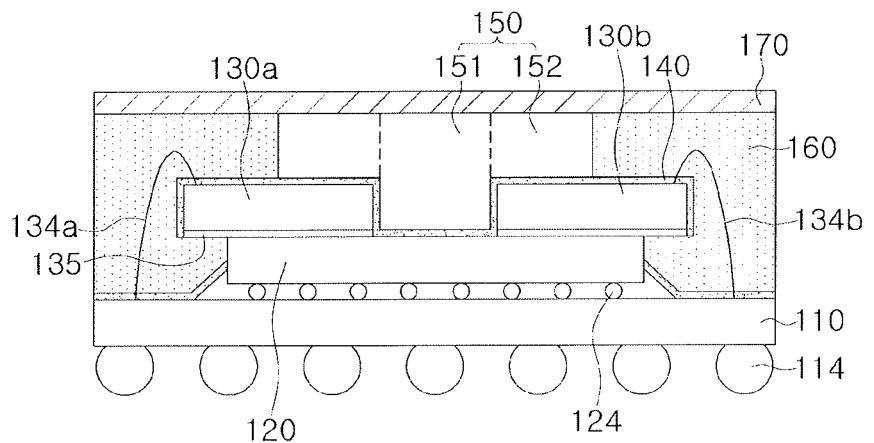

Referring to FIG. 8, a reinforcing member 170 may be formed on an upper surface of each of the first region 151 and the second region 152 of the heat dissipation member 150 and an upper surface of the molding member 160. The reinforcing member 170 may be formed using, e.g., a spray coating process, a physical vapor deposition (PVD) process, a chemical vapor deposition (CVD) process, or the like. The reinforcing member 170 may be formed to have a thickness of, e.g., about 5 to about 40 μm.

The reinforcing member 170 may include a polymer compound having a modulus of elasticity and a CTE higher than those of the heat dissipation member 150 and the molding member 160.

Finally, connection terminals 114 may be formed below the package substrate 110. The connection terminals 114 may be connected to pads on a lower surface of the package substrate 110. The connection terminals 114 may be solder balls.

Figure 9:
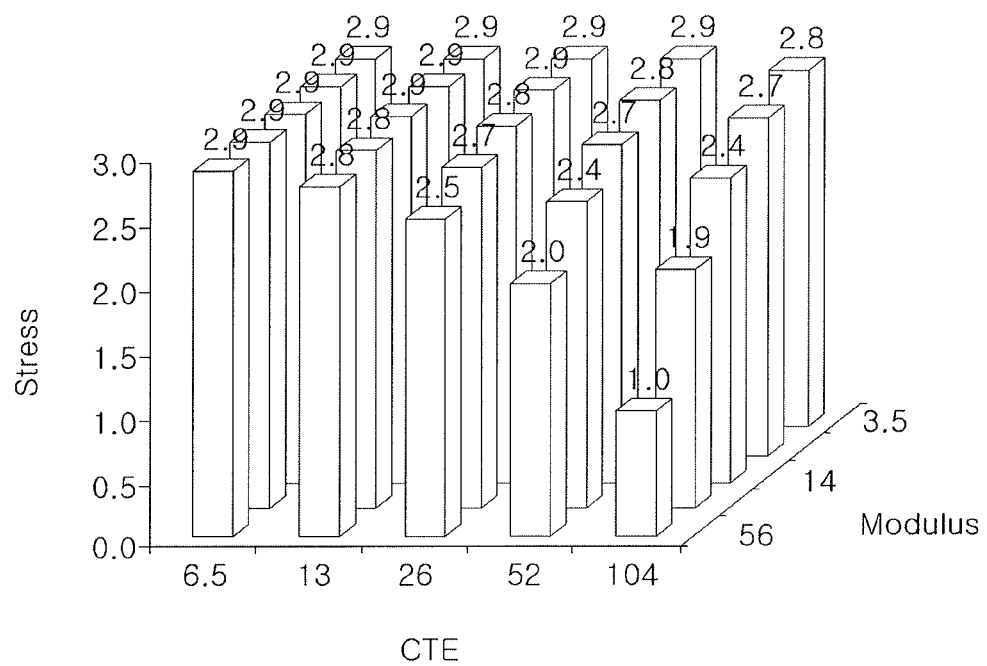
FIG. 9 illustrates a graph showing stress, applied to a heat dissipation member, depending on physical properties (CTE and modulus of elasticity) of a reinforcing member of the semiconductor package in FIG. 1.

FIG. 9 illustrates a graph showing stress, applied to a heat dissipation member, depending on physical properties (CTE and modulus of elasticity) of a reinforcing member in the semiconductor package in FIG. 1.

Figure 10A:
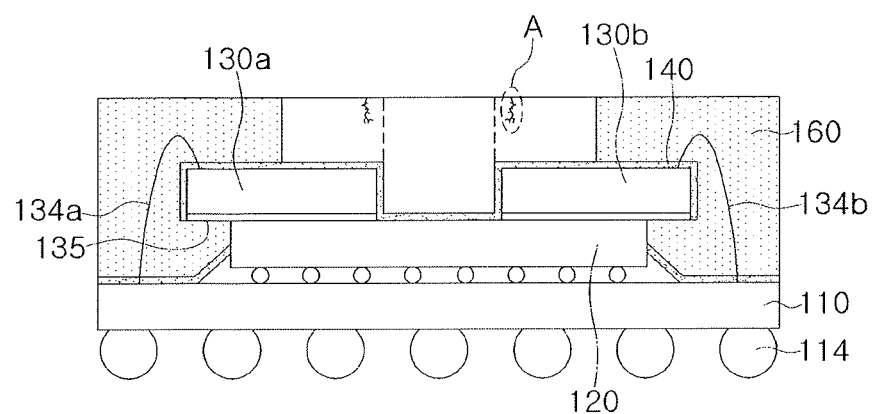
FIG. 10A illustrates a cross-sectional view of cracking occurring in a heat dissipation member when a reinforcing member is absent in a semiconductor package.
Figure 10B:
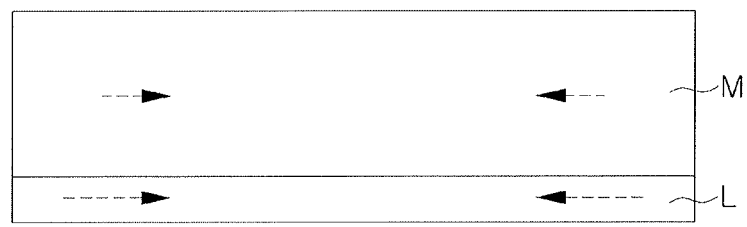
FIGS. 10B and 10C illustrate cross-sectional views of the principle that stress, applied to a package, is released by a reinforcing member having a high coefficient of thermal expansion.
Figure 10B:
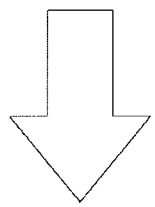
Figure 10B:
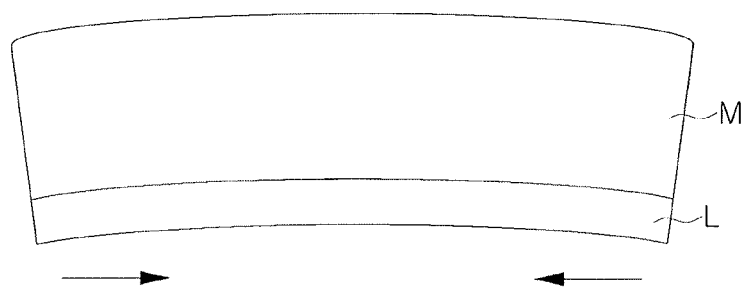
Figure 10C:
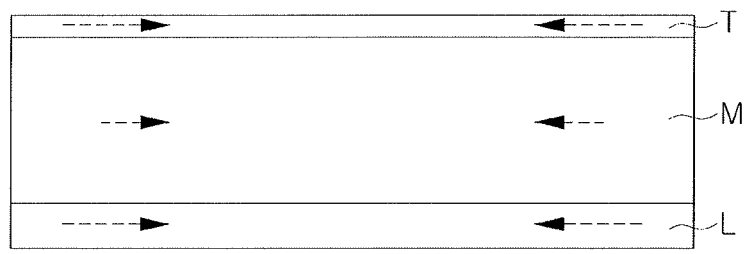
Figure 10C:
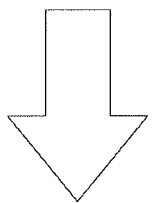
Figure 10C:
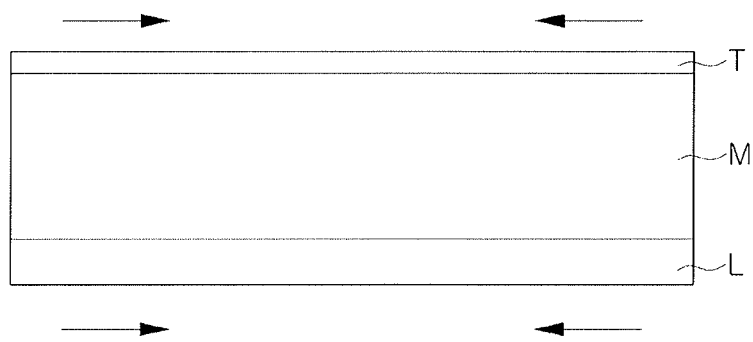

FIG. 10A illustrates a cross-sectional view showing cracking occurring in a heat dissipation member when a reinforcing member is absent in a semiconductor package. FIGS. 10B and 10C illustrate cross-sectional views of the principle that stress, applied to a package, is released by a reinforcing member having a high coefficient of thermal expansion. In FIG. 9, a unit of CTE is ppm/° C., and a unit of a modulus of elasticity is GPa.

Referring to FIG. 9, it can be confirmed that as a CTE and a modulus of elasticity of the reinforcing member 170 are increased, stress applied to the heat dissipation member 150 is decreased. It will be understood that the reinforcing member 170 has a modulus of elasticity greater than a modulus of elasticity of each of the heat dissipation member 150 and the molding member 160 to disperse stress applied to the heat dissipation member 150, and the reinforcing member 170 has a CTE greater than a CTE of each of the heat dissipation member 150 and the molding member 160 to offset warpage stress caused by a difference in the CTE between the package substrate 110, and the molding member 160 and the heat dissipation member 150. For example, a relative value of the stress, applied to the heat dissipation member 150, may be decreased to 2.0 or less at a CTE of about 50 ppm/° C. or more and a modulus of elasticity of about 35 GPa or more.

Referring to FIG. 10A, when the molding member 160 exposes the upper surface of the heat dissipation member 150 to secure a heat dissipation path, cracking (indicated by 'A') could occur in the upper surface of the heat dissipation member 150 due to external impacts or a thermal cycle test. Such a phenomenon may mainly occur at or near a boundary between the first region 151 and the second region 152 of the heat dissipation member 150.

Referring to FIG. 10B, the cracking, occurring in FIG. 10A, may be caused by a difference in CTE between a package substrate L, below a semiconductor package, and a middle layer M including a semiconductor chip, a molding member, a heat dissipation member, and the like, above the semiconductor substrate L. In the drawing, the magnitude of a CTE (the degree of thermal deformation) of the package substrate L and the middle layer M is indicated by arrow dotted lines (see an upper drawing in FIG. 10B). The CTE of the package substrate L may be greater than the CTE of the middle layer M, and shrinkage of the package substrate L may be relatively great and warpage stress may be generated as indicated by arrow solid lines after a heat cycle test is performed (see a lower drawing in FIG. 10B).

Referring to FIG. 10C, in an example embodiment, a reinforcing member T may be on the middle layer M. A CTE of the reinforcing member T may be greater than the CTE of the middle layer M (see an upper drawing in FIG. 10C). In this case, warpage stress, generated by the shrinkage of the reinforcing member T on an opposing side of the package substrate 110, and warpage stress, generated in the package substrate L, may offset by each other (see a lower drawing in FIG. 10C). For example, the stress applied to the middle layer M may be released to improve warpage characteristics of the semiconductor package.

Figure 11:
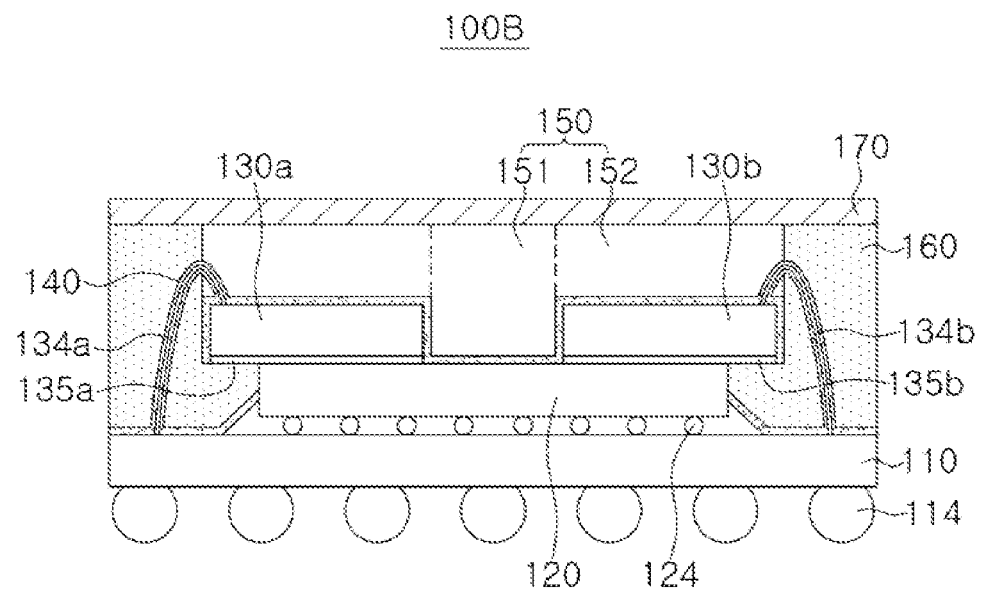
FIG. 11 illustrates a side cross-sectional view of a semiconductor package according to an example embodiment.

FIG. 11 illustrates a side cross-sectional view of a semiconductor package 100B according to an example embodiment.

Referring to FIG. 11, in the semiconductor package 100B according to an example embodiment, an insulating layer 140 may be coated on surfaces of bonding wires 134a and 134b, and a heat dissipation member 150 may cover the bonding wires 134a and 134b.

The insulating layer 140 may be coated on the surfaces of the bonding wires 134a and 134b when an insulating material is applied to entire exposed surfaces of a package substrate 110, a first semiconductor chip 120, and a second semiconductor chip 130a and 130b in, e.g., a spray coating process.

Accordingly, even when the second region 152 of the heat dissipation member 150 is formed to cover the bonding wires 134a and 134b, the bonding wires 134a and 134b and the heat dissipation member 150 may be electrically insulated by the insulating layer 140.

For example, the second region 152 of the heat dissipation member 150, on the second semiconductor chip 130a and 130b, may cover most of upper surface of the second semiconductor chip 130a and 130b, when viewed from above. The second region 152 may extend to a region, in which the boding wires 134a and 134b are disposed, to cover portions of surfaces of the bonding wires 134a and 134b coated with the insulating layer 140.

As a result, an area of a region, in which the heat dissipation member 150 is formed, may be increased to further improve heat dissipation performance. The description of the components of this embodiment may refer to the descriptions of the same or similar components of the semiconductor package 100A, illustrated in FIG. 1, unless specifically described otherwise.

FIG. 12 illustrates a side cross-sectional view of a semiconductor package 100C according to an example embodiment.

Referring to FIG. 12, the semiconductor package 100C according to an example embodiment may include a single second semiconductor chip 130a on one side of the first semiconductor chip 120. The second semiconductor chip 130a may overlap a portion of the first semiconductor chip 120 such that a portion of an upper surface of the first semiconductor chip 120 is exposed, when viewed from above.

A second region 152 of a heat dissipation member 150 may be formed in a region in which the first semiconductor chip 120 and the second semiconductor chip 130a overlap each other, and a first region 151 of the heat dissipation member 150 may be formed in a region in which the first semiconductor chip 120 and the second semiconductor chip 130a do not overlap each other. The description of the components of this embodiment may refer to the descriptions of the same or similar components of the semiconductor package 100A, illustrated in FIG. 1, unless specifically described otherwise.

Figure 14:
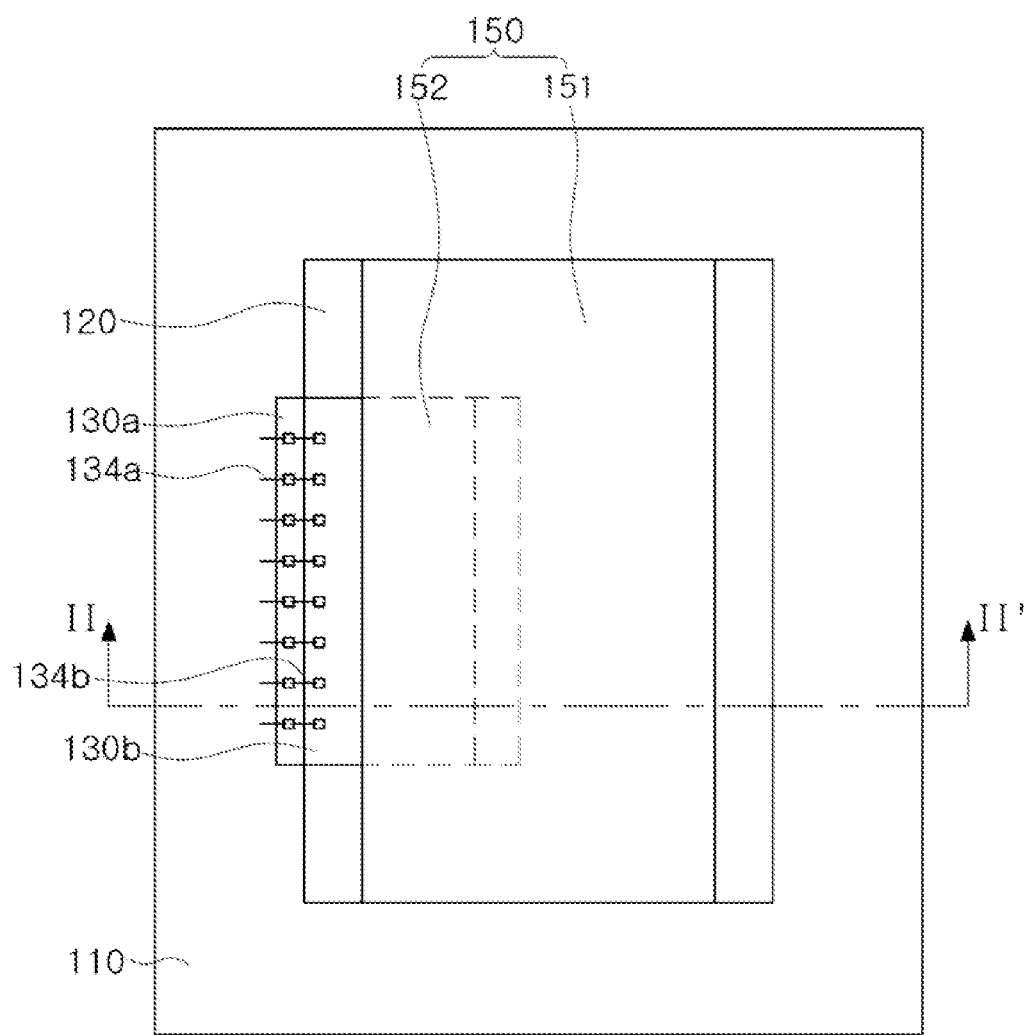
FIG. 14 illustrates a plan view of a partial configuration of the semiconductor package in FIG. 13.

FIG. 13 illustrates a side cross-sectional view of a semiconductor package 100D according to an example embodiment, and FIG. 14 illustrates a plan view of a partial configuration of the semiconductor package in FIG. 13.

Referring to FIGS. 13 and 14, the semiconductor package 100D according to an example embodiment may include a plurality of second semiconductor chips 130a and 130b stacked on one side of a first semiconductor chip 120 (e.g., stacked in an offset or misaligned arrangement). The plurality of second semiconductor chips 130a and 130b may be stacked on the first semiconductor chip 120 by using attachment members 135a and 135b, respectively. When viewed from above, an exposed area of the first semiconductor chip 120 (when the plurality of second semiconductor chips 130a and 130b are stacked) may be increased to be larger than that of the first semiconductor chip 120 when the plurality of second semiconductor chips 130a and 130b are side by side in a lateral direction.

The plurality of second semiconductor chips 130a and 130b may be alternately arranged to expose each connection pad, when viewed from above (see FIG. 14). The plurality of second semiconductor chips 130a and 130b may be electrically connected to the package substrate 110 by bonding wires 134a and 134b.

A first region 151 of the heat dissipation member 150 may be on an insulating layer 140 on an upper surface of the first semiconductor chip 120, and a second region 152 of the heat dissipation member 150 may be on an insulating layer 140 on an upper surface of the overlying stacked second semiconductor chip 130b among the plurality of second semiconductor chips 130a and 130b. For example, when the insulating layer 140 is coated on surfaces of the bonding wires 134a and 134b, the second region 152 of the heat dissipation member 150 may also be formed on the insulating layer 140 formed on an upper surface of the underlying stacked second semiconductor chip 130a among the plurality of second semiconductor chips 130a and 130b. The description of the components of this embodiment may refer to the descriptions of the same or similar components of the semiconductor package 100A, illustrated in FIG. 1, unless specifically described otherwise.

FIG. 15 illustrates a side cross-sectional view of a semiconductor package 100E according to an example embodiment.

Referring to FIG. 15, the semiconductor package 100E according to an example embodiment may include a plurality of second semiconductor chips 130a and 130b stacked on one side of a first semiconductor chip 120 to overlap each other (e.g., such that edges of the second semiconductor chips 130a and 130b are aligned). The plurality of second semiconductor chips 130a and 130b may be stacked on the first semiconductor chip 120 by attachment members 135a and 135b, respectively.

The plurality of second semiconductor chips 130a and 130b may overlap each other, when viewed from above. For example, an area of the first semiconductor chip 120 exposed on a plane may be larger than that of the first semiconductor chip 120 when the plurality of second semiconductor chips 130a and 130b are alternately disposed (e.g., misaligned or offset). The plurality of second semiconductor chips 130a and 130b may be electrically connected to the package substrate 110 by bonding wires 134a and 134b.

A first region 151 of the heat dissipation member 150 may be on an insulating layer 140, on an upper surface of the first semiconductor chip 120. A second region 152 of the heat dissipation member 150 may be on an insulating layer 140 on an upper surface of an overlying staked second semiconductor chip 130b among the plurality of second semiconductor chips 130a and 130b. The description of the components of this embodiment may refer to the descriptions of the same or similar components of the semiconductor package 100A, illustrated in FIG. 1, unless specifically described otherwise. In addition, among the above-described various embodiments, two or more embodiments may be combined with each other as long as there is no technical limitation.

Figure 16:
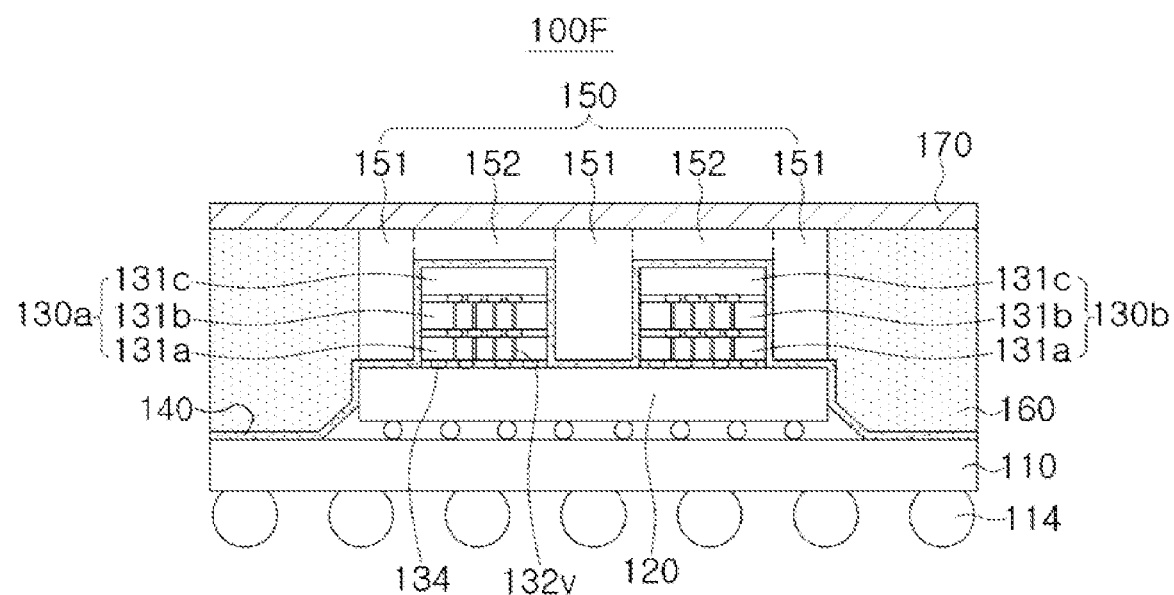
FIG. 16 illustrates a side cross-sectional view of a semiconductor package according to an example embodiment.

FIG. 16 illustrates a side cross-sectional view of a semiconductor package 100F according to an example embodiment.

Referring to FIG. 16, at least one second semiconductor chip 130a and 130b may include a high bandwidth memory (HBM). The at least one second semiconductor chip 130a and 130b may include a buffer die 131a and a plurality of memory dies 131b and 131c stacked sequentially. In an implementation, as illustrated in the drawing, two memory dies 131b and 131c may be stacked, or a greater number of memory dies may be stacked. The buffer die 131a and the plurality of memory dies 131b and 131c may be electrically connected to each other by through-silicon vias (TSVs) 132v. The buffer die 131a and the plurality of memory dies 131b and 131c may communicate a data signal and a control signal through the TSVs 132v. The buffer die 131a may be electrically connected to the first semiconductor chip 120 by a plurality of connection terminals 134.

For example, the plurality of second semiconductor chips 130a and 130b may be side by side and spaced apart from each other on an upper surface of the first semiconductor chip 120 such that a central portion and an external portion of the first semiconductor chip 120 are exposed, when viewed from above. In this case, first regions 151 of a heat dissipation member 150 may be on the insulating layer 140 coated on the central portion and the external portion of the first semiconductor chip 120 exposed, when viewed from above, and second regions 152 of the heat dissipation member 150 may be on the insulating layer 140 coated on upper surfaces of the plurality of second semiconductor chip 130a and 130b. The description of the components of this embodiment may refer to the descriptions of the same or similar components of the semiconductor package 100A, illustrated in FIG. 1, unless specifically described otherwise. In addition, among the above-described various embodiments, two or more embodiments may be combined with each other as long as there is no technical limitation.

FIGS. 17 to 22 illustrate side cross-sectional views of stages in a method of manufacturing the semiconductor package 100F in FIG. 16. The semiconductor package 100F may be manufactured by a method identical or similar to the method of manufacturing the semiconductor package 100A described with reference to FIGS. 3 to 8, respectively corresponding to FIGS. 17 to 22. Hereinafter, a description will be given to focus on a difference between the method of manufacturing the semiconductor package 100F in FIGS. 17 to 22 and the method of manufacturing the semiconductor package 100A in FIGS. 3 to 9.

Figure 17:
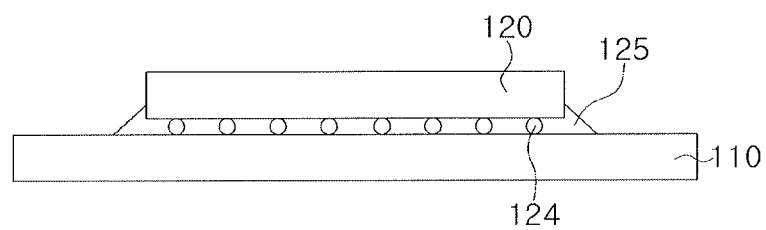
FIGS. 17 to 22 illustrate side cross-sectional views of stages in a method of manufacturing the semiconductor package in FIG. 16.

Referring to FIG. 17, similarly to the processes described in FIG. 3, a first semiconductor chip 120 may be mounted on a package substrate 110.

Figure 18:
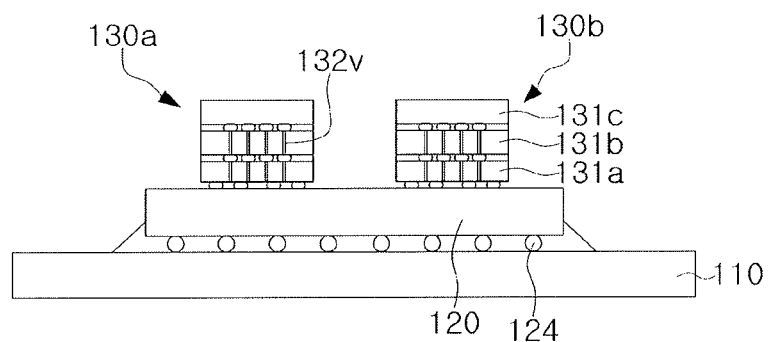

Referring to FIG. 18, a plurality of second semiconductor chips 130a and 130b, including a high bandwidth memory (HBM), may be disposed side by side and spaced apart from each other on an upper surface of a first semiconductor chip 120 such that a central portion and an external portion (e.g., outer edges) of the first semiconductor chip 120 are exposed, when viewed from above.

Each of the plurality of second semiconductor chips 130a and 130b may include a buffer die 131a and a plurality of memory dies 131b and 131c, sequentially stacked. The buffer die 131a and the plurality of memory dies 131b and 131c may be electrically connected to each other by through-silicon vias (TSVs) 132v. The buffer die 131a may be electrically connected to the first semiconductor chip 120 by a plurality of connection terminals.

Figure 19:
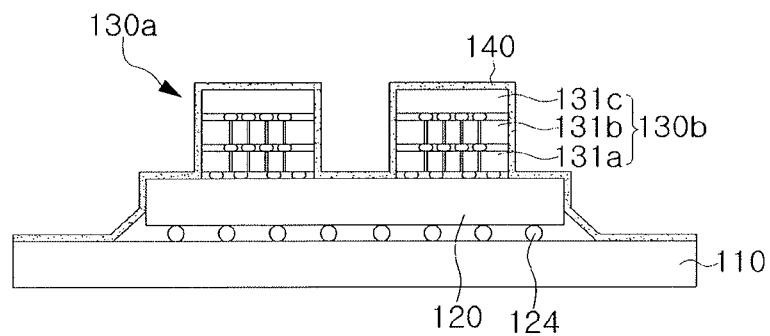

Referring to FIG. 19, an insulating layer 140 may be formed on the package substrate 110, the first semiconductor chip 120, and the plurality of second semiconductor chips 130a and 130b. For example, an insulating material, constituting the insulating layer 140, may be conformally applied on entire exposed surfaces of the package substrate 110, the first semiconductor chip 120, and the second semiconductor chip 130a and 130b by a spray coating process.

Figure 20:
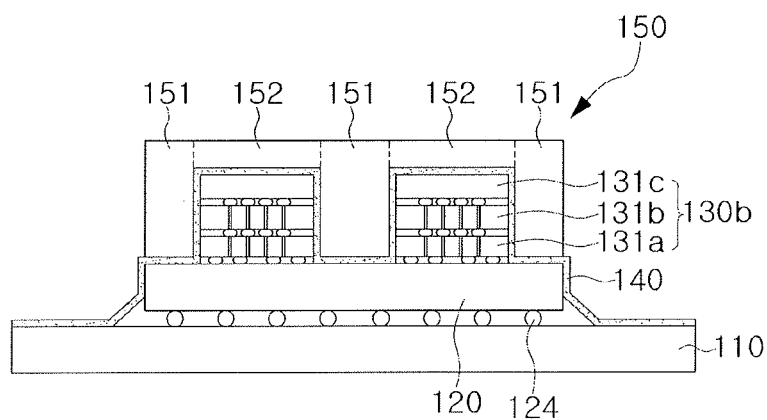

Referring to FIG. 20, a heat dissipation member 150, having first regions 151 and second regions 152, may be formed on the first semiconductor chip 120 and the plurality of second semiconductor chips 130a and 130b. The first regions 151 may be on the insulating layer 140, coated on upper surfaces of a central portion and an outer portion of the first semiconductor chip 120 on which the plurality of second semiconductor chips 130a and 130b are not disposed, and the second regions 152 may be on the insulating layer 140 coated on upper surfaces of the plurality of second semiconductor chips 130a and 130b.

Figure 21:
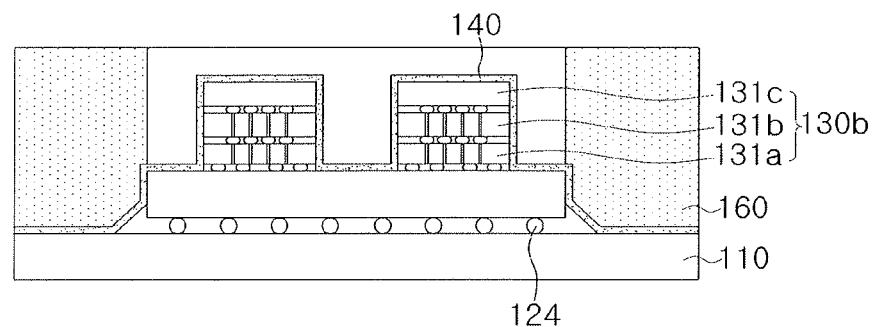
Figure 22:
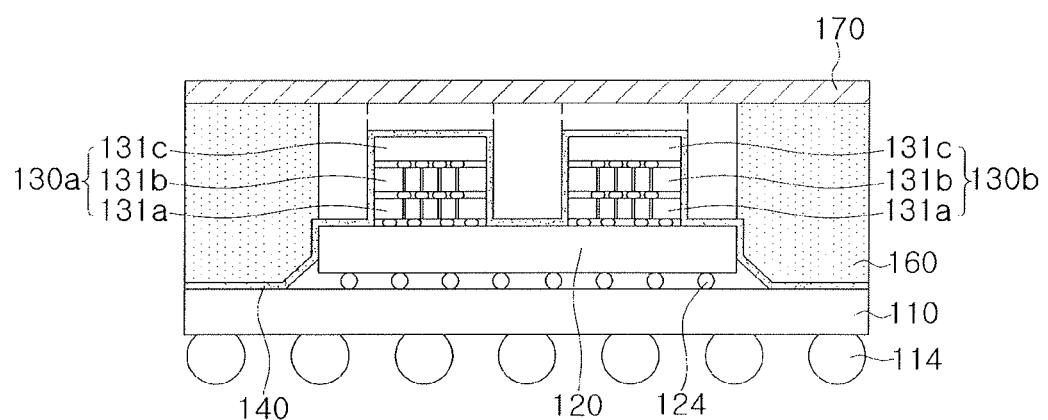

Referring to FIGS. 21 and 22, similarly to the processes described in FIGS. 7 and 8, a molding member 160 may be formed and a reinforcing member 170 and connection terminals 114 may be formed. As a result, a semiconductor package may be manufactured.

By way of summation and review, in a system in package (SIP), a heat dissipation path may be limited or blocked by other semiconductor chips embedded with a semiconductor chip in which excessive heat generation occurs, e.g., a logic chip. It may be difficult to dissipate heat, generated in a package, outwardly of the package. In addition, warpage or cracking could occur due to a difference in coefficients of thermal expansion (CTE) between a plurality of semiconductor chips and other materials constituting the semiconductor chip.

As described above, according to example embodiments, a reinforcing member may be introduced to an upper portion (e.g., outwardly-facing side) of a heat dissipation member to provide a semiconductor package having good heat dissipation performance and good warpage characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
a package substrate;
a first semiconductor chip on the package substrate;
at least one second semiconductor chip on a region of an upper surface of the first semiconductor chip;
an insulating layer on surfaces of the first semiconductor chip and the at least one second semiconductor chip;
a heat dissipation member on the insulating layer such that the heat dissipation member includes:
a region on an upper surface of the first semiconductor chip on which the at least one second semiconductor chip is not disposed, and
a region on an upper surface of the at least one second semiconductor chip;
a molding member on the package substrate and encapsulating the first semiconductor chip, the at least one second semiconductor chip, and the heat dissipation member such that the molding member exposes at least a portion of an upper surface of the heat dissipation member; and
a reinforcing member on the heat dissipation member and the molding member,
wherein the reinforcing member has a coefficient of thermal expansion (CTE) greater than a CTE of the heat dissipation member and greater than a CTE of the molding member.

2. The semiconductor package as claimed in claim 1, wherein the reinforcing member has a thickness of 10 to 30 µm.

3. The semiconductor package as claimed in claim 1, wherein the reinforcing member:
includes a polymer compound, and
is in direct contact with the upper surface of the heat dissipation member.

4. The semiconductor package as claimed in claim 3, wherein the upper surface of the heat dissipation member is on a same level as an upper surface of the molding member.

5. The semiconductor package as claimed in claim 1 wherein:
each of the heat dissipation member and the molding member independently has a CTE of 5 to 40 ppm/° C., and
the reinforcing member has a CTE of 50 ppm/° C. or greater.

6. The semiconductor package as claimed in claim 1, further comprising:
a connection member on a lower surface of the first semiconductor chip to electrically connect the first semiconductor chip to the package substrate; and
an underfill resin covering the lower surface of the first semiconductor chip and the connection member,
wherein the insulating layer covers a side surface of the underfill resin.

7. The semiconductor package as claimed in claim 1, wherein the insulating layer is on an upper surface of the package substrate, an upper surface and at least a portion of a side surface of the first semiconductor chip, on which the at least one second semiconductor chip is not disposed, and an upper surface and a side surface of the at least one second semiconductor chip.

8. The semiconductor package as claimed in claim 1, wherein the at least one second semiconductor chip is electrically connected to the package substrate by a bonding wire.

9. The semiconductor package as claimed in claim 8, wherein the insulating layer is on a surface of the bonding wire.

10. The semiconductor package as claimed in claim 9, wherein the heat dissipation member covers a portion of the bonding wire.

11. The semiconductor package as claimed in claim 1, wherein:
the at least one second semiconductor chip includes a plurality of semiconductor chips, and
the plurality of second semiconductor chips are spaced apart from each other on the upper surface of the first semiconductor chip such that the plurality of second semiconductor chips do not overlap a central portion of the first semiconductor chip, when viewed from above perpendicular to the package substrate.

12. The semiconductor package as claimed in claim 1, wherein:
the at least one second semiconductor chip includes a plurality of second semiconductor chips, and
the plurality of second semiconductor chips are stacked on a part of the upper surface of the first semiconductor chip.

13. A semiconductor package, comprising:
a package substrate;
a first semiconductor chip on the package substrate;
a heat dissipation member on a part of an upper surface of the first semiconductor chip;
a molding member on the package substrate and covering an upper surface of the package substrate, one side surface of the first semiconductor chip, and one side surface of the heat dissipation member such that the molding member exposes at least a portion of an upper surface of the heat dissipation member; and
a reinforcing member on the heat dissipation member and the molding member,
wherein the reinforcing member includes a polymer compound and has a coefficient of thermal expansion greater than a coefficient of thermal expansion of the heat dissipation member and greater than a coefficient of thermal expansion of the molding member.

14. The semiconductor package as claimed in claim 13, further comprising:
a second semiconductor chip on the upper surface of the first semiconductor chip;
an underfill resin covering a lower surface of the first semiconductor chip; and
an insulating layer covering at least a region of the upper surface of the first semiconductor chip, an upper surface and a side surface of the second semiconductor chip, and a side surface of the underfill resin,
wherein the second semiconductor chip is a memory chip.

15. A semiconductor package, comprising:
a package substrate;
a first semiconductor chip on the package substrate;
at least one second semiconductor chip on the first semiconductor chip;
an insulating layer on surfaces of the package substrate, the first semiconductor chip, and the at least one second semiconductor chip;
a heat dissipation member on the insulating layer such that the heat dissipation member includes:
a region on the first semiconductor chip that is not overlapped by the at least one second semiconductor chip, and
a region on the at least one second semiconductor chip that overlaps the first semiconductor chip, when viewed from above perpendicular to the package substrate;
a molding member on the package substrate and encapsulating at least a portion of each of the first semiconductor chip, the at least one second semiconductor chip, and the heat dissipation member; and
a reinforcing member on the heat dissipation member and the molding member,
wherein the reinforcing member has a coefficient of thermal expansion (CTE) greater than a CTE of the heat dissipation member and greater than a CTE of the molding member.

16. The semiconductor package as claimed in claim 15, wherein:
each of the heat dissipation member and the molding member independently has a CTE of 5 to 40 ppm/° C., and
the reinforcing member has a CTE of 50 ppm/° C. or greater.

17. The semiconductor package as claimed in claim 15, wherein:
the heat dissipation member has a modulus of elasticity of 10 to 20 GPa,
the molding member has a modulus of elasticity of 20 to 35 GPa, and
the reinforcing member has a modulus of elasticity of 35 GPa or greater.

18. The semiconductor package as claimed in claim 15, wherein the reinforcing member is in direct physical contact with an upper surface of the heat dissipation member.

19. The semiconductor package as claimed in claim 15, wherein:
the at least one second semiconductor chip includes a plurality of second semiconductor chips, and
the plurality of second semiconductor chips are stacked on a part of an upper surface of the first semiconductor chip.

* * * * *